United States Patent [19]

Price

[11] 4,151,426
[45] Apr. 24, 1979

[54] SECURITY TIMER DEVICE

[75] Inventor: Edward G. Price, Salt Lake City, Utah

[73] Assignee: Beehive International, Salt Lake City, Utah

[21] Appl. No.: 815,528

[22] Filed: Jul. 14, 1977

[51] Int. Cl.² ............................................... H03K 5/13
[52] U.S. Cl. ..................................... 307/141; 307/293; 340/309.1
[58] Field of Search ...................... 307/139, 141, 141.4, 307/141.8, 157, 252 B, 293, 220 R, 225 R; 200/38 R, 38 AF, 38 FA, 38 FB, 38 B, 38 CA, 38 C, 38 D, 38 DA, 38 DB, 38 DC, 38 E; 340/309.1, 309.2, 309.3, 309.4, 309.5; 58/33; 315/360; 328/61, 48

[56] References Cited

U.S. PATENT DOCUMENTS

| 3,035,187 | 5/1962 | Reichert | 328/48 X |
| 3,491,249 | 1/1970 | Rabinow | 307/141 |
| 3,979,601 | 9/1976 | Franklin | 307/141 |
| 3,997,742 | 12/1976 | Marquis | 200/38 FB |

Primary Examiner—Robert K. Schaefer
Assistant Examiner—Morris Ginsburg
Attorney, Agent, or Firm—Criddle, Thorpe & Western

[57] ABSTRACT

A solid state timer device useable for security purposes in homes, offices and other buildings. The device is engineered to plug into a conventional wall socket and to receive the inlet plugs of appliances such as lamps and radios. The device is programmed to connect intermittently, in the desired sequence and for desired periods, power from the wall plug to the electrical appliance in question so that the same will go on and off automatically over a period of time and then will remain off for another period of time before resuming the said subsequence of operation. Such switching of lamps and radios on and off, for example, will create the illusion of occupancy and is intended to discourage would-be burglars and prowlers.

9 Claims, 2 Drawing Figures

SECURITY TIMER DEVICE

FIELD OF INVENTION

The present invention relates to security devices and, more particularly, to an improved device which is useful for aiding the simulation of the presence of occupants in the building, even though the building itself may be unoccupied and left unoccupied for a substantial period of time.

DESCRIPTION OF PRIOR ART

Security is a common concern today, both for homeowners and apartment dwellers as well as for businesses. Darkened buildings during dusk or nighttime hours is an attraction to potential thieves and prowlers. Such individuals would be discouraged from seeking an unlawful entry where the lighting in the building is such as to simulate occupancy.

No art is known for programming as herein an electrical appliance in a system for deterring unwanted intruders.

BRIEF DESCRIPTION OF INVENTION

In the present invention, in a preferred embodiment thereof, a timer device is provided which can be inserted into a conventional wall plug. The timer serves as an intermediary device between the wall plug and the electrical appliances such as radios, lamps, or other house lighting, for example. Let us assume that a lighting sequence is desired, beginning at 6:00 PM in the evening. The device is then plugged into the wall socket at this time and then, at the same hour of the day either that day or at a following day, an electrical lamp, for example, is plugged into the device. The timer is arranged such that the lamp or other appliance will be switched on and off every 22½ minutes, with this interval of time being both the duration of lighting and the time spacing between successive illuminations. This will continue to occur for a period of six hours, after which the device will turn off the lamp and keep the same off for a period of 18 hours. Thereafter the cycle is repeated.

The time spacings and time durations indicated are given by way of example only and these may be altered in the design of the equipment where desired.

According to the present invention in a preferred embodiment thereof, an integrated circuit chip having a series of divider stages is provided in conjunction with a solid state resistance-capacitance oscillator. Selected outputs from the integrated circuit are routed to a diode summing network which couples to a means for controlling the application of output power to the output receptacle of the device.

OBJECTS

Accordingly, a principal object of the present invention is to provide a new and improved timer device for security purposes.

A further object is to provide a timer that can be of the solid state type and packaged in small dimensions.

An additional object is to provide a timer device incorporating by way of an integrated circuit chip, a series of divider stages that are usable with an input oscillator provided.

An additional object is to provide a solid state timer device that is conveniently inserted into the conventional duplex wall receptacle of a residence or other building, the device also including a receptacle for receiving a lamp-cord plug or the plug of another type of appliance.

A further object is to provide an inexpensively produced timer device which, in conjunction with a lighting means, will give intermittent periods of illumination during the early nighttime hours between 6:00 PM – 12:00 PM, to be followed thereafter by a period of non-illumination of eighteen hours until the next predetermined dusk hour appears.

The features of the present invention which are believed to be novel are set forth with particularity in the appended claims. The present invention, both as to its operation and manner of operation, together with further objects and advantages thereof, may best be understood by reference to the following description, taken in connection with the accompanying drawings in which:

DESCRIPTION OF PREFERRED EMBODIMENTS

Figure 1:
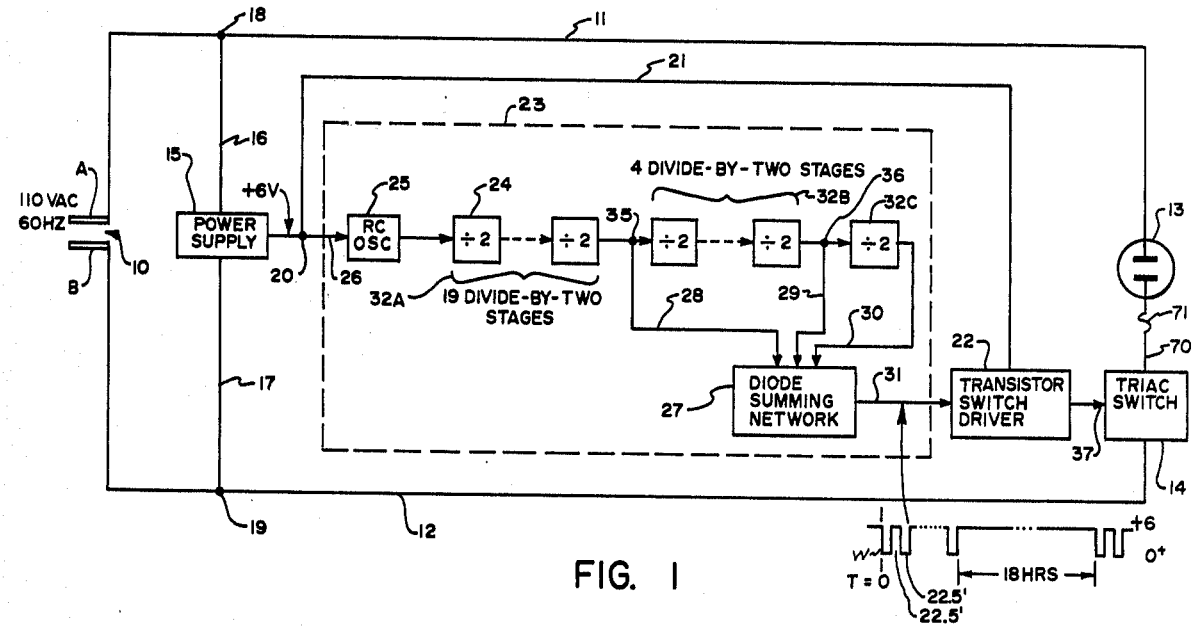
FIG. 1 is a diagram of the device of the present invention in a preferred form thereof.

A block diagram of the timer of the invention is shown in FIG. 1. The prongs A and B of input plug 10 are conventional in design, are coupled by leads 11 and 12 to receptacle 13 and also to triac switch 14 in the manner indicated, the latter two being connected by lead 70 and fuse 71. The power supply 15 intercouples the series-coupled receptacle 13 and triac switch 14 directly as shown. Leads 16 and 17 are connected between junctions 18 and 19 and power supply 15. Power supply 15 supplies, for example, a positive 6-volt DC potential at junction 20. Lead 21 is coupled between junction 20 and transistor switch driver 22 which shall be hereinafter explained. The dotted line rectangle 23 comprises a solid-state frequency divider, which incorporates a series of divider stages 24, and RC, i.e. resistance capacitance oscillator 25. Power supply 15 provides power to RC oscillator 25 via lead 26, coupled thereto. The output of such oscillator is coupled to successive divider stages which are provided with leads 28, 29, and 30 connecting to a divider or high-value resistor summing network 27. The output of the diode summing network 27 is coupled by lead 31 to transistor switch driver 22.

The general circuit shown in schematic form in FIG. 1 operates as follows:

One-hundred ten volt, 60 hertz, alternating current power is supplied at plug 10 and thus will be applied to the input plug receptacle 13 only at times when triac switch 14, manufactured by the Motorola Corporation, is closed as through the reception thereby of a positive current pulse from transistor driver switch 22.

Inside frequency divider stage 23 is a resistant-capacitance oscillator 25, powered by power supply 15, which generates a square-wave output voltage at a frequency of approximately 194 hertz. This square-wave output voltage is applied to 19 divide-by-two stages 32A, then 4 divide-by-two stages 32B and finally 1 last divide-by-two stage 32C. The prior groups of stages are referred to by numerals 32A and 32B as indicated. The output from the final divider 32C is a square-wave voltage having a period of 24 hours, i.e. 12 hours "on" and 12 hours "off."

The output of the first nineteen divide-by-two stages of group 32A and at junction 35 is a square-wave, pulse-train voltage whose period is 45 minutes: 22.5 minutes on and 22.5 minutes off. Correspondingly, the output voltage wave form appearing at junction 36, i.e. the output of the four divide-by-two stages 34, is a square-wave voltage whose period is 12 hours; 6 hours on and 6 hours off, and the output of final divider stage 32C is 12 hours on and 12 hours off. For all three outputs the respective periods commence a positive rise at time t = 0.

These three voltage outputs appearing at leads 28, 29, and 30 are fed to and combined in the diode summing network 27 to produce a negative voltage pulse wave form W comprising a series of spaced trains of pulses for application to the input of transistor switch driver 22 as follows:

A series of group of pulses having a period of 45 minutes, 22.5 minutes "on," and 22.5 minutes "off" is provided. Each group or series of such pulses will be separated by a time interval of 18 hours. This is indicated generally in FIG. 1 at W proximate the lead numbered 31.

The transistor switch driver, provided positive voltage via lead 21 from power supply 15, inverts such wave form W as shown in FIG. 1 to a similar but positive pattern of current pulses which are applied to the gate or input at 37 of triac switch 14. Triac switch 14 is conventional and is designed such that, upon the reception of a positive current pulse at input 37, the triac switch 14 will close so that alternating-current voltage is applied across receptacle 13, via leads 11 and 12. Accordingly, a voltage or potential difference will appear across receptacle 13, to power an appliance such as a light or radio, at times when negative voltage pulses as shown and applied to transistor switch driver 22 appear, since positive current pulses corresponding thereto and applied to the input of triac switch 14 will close such switch in the manner indicated.

Figure 2:
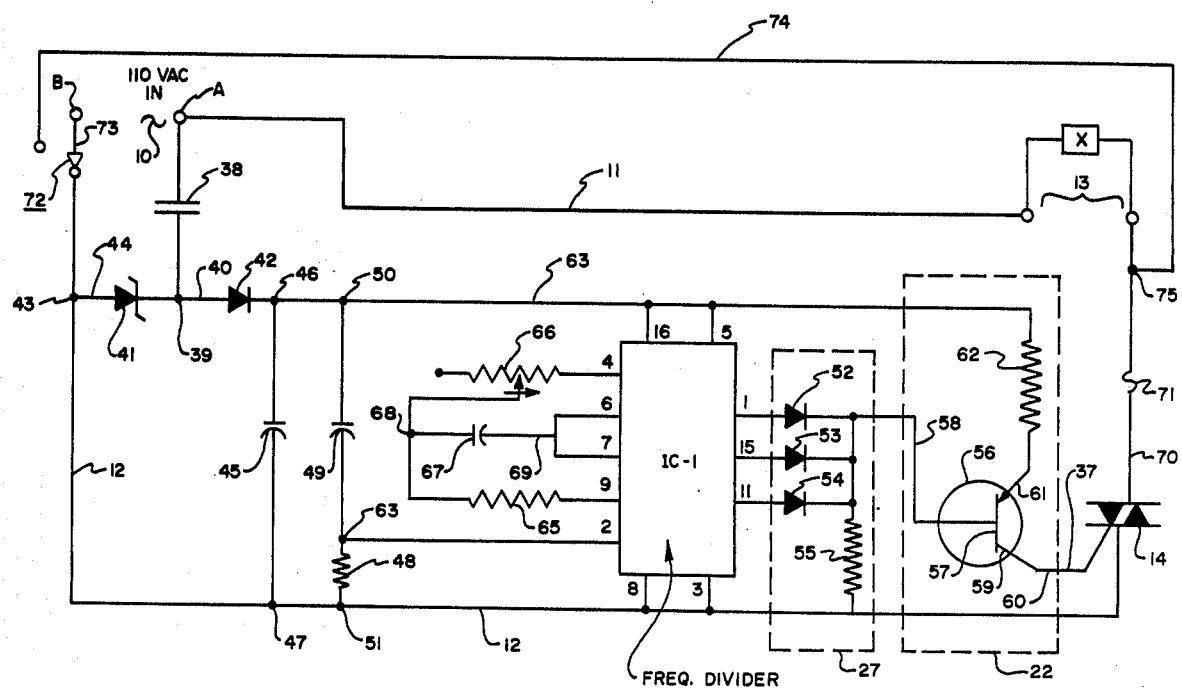
FIG. 2 is an electrical schematic illustrating a practical form of the circuit of FIG. 1.

FIG. 2 is a practical schematic of the block diagram circuit of FIG. 1. Prong B is connected to a two-way switch 72, connectable by switch arm 73 to lead 12, or, alternatively, to timer bypass lead 74 extending to junction 75. Prong A in FIG. 2 is seen to be coupled by capacitor 38 to the junction 39 of lead 40 which interconnects with zener diode 41 and diode 42. Zener diode 41 is likewise connected to lead 12 at junction 43 by lead 44. Capacitor 45 intercouples junctions 46 and 47, and the resistance-capacitance combination of resistor 48 and capacitor 49 interconnect junctions 50 and 51. Zener diode 41, diode 42, and capacitor 45 form a DC power supply circuit.

Diode summing network 27 includes conventional diodes 52, 53, and 54, which are connected in parallel and, in their combination, in series with resistor 55. The transistor switch driver 22 of FIG. 1 comprises the rectangular dashed line 22 in FIG. 2 and includes PNP transistor 56, the base 57 of which is coupled by lead 58 to the diode summing network 27 as indicated. Collector 59 is coupled by lead 60 to triac switch 14. Emitter 61 is coupled through resistor 62 to the line 73 which includes junction 50.

The diode summing network 27 as shown in FIGS. 1 and 2 is, of course, strictly conventional. Likewise, transistor switch driver is simply a transistor stage which inverts incoming voltage pulses of negative polarity to large current pulses of positive polarity, for actuating, i.e. closing triac switch 14 sequentially as described in the wave form shown in FIG. 1 relative to lead 31. Diode 41 is a zener type diode which simply clips the incoming voltage at plus 6.2 volts and minus 0.7 volts. Diode 42 is a rectifier, passing only the plus 6 volt pulses to capacitor 45, the latter holding the voltage level across itself to plus 6 volts DC. This voltage is applied to pins 16 and 5 of integrated circuit chip IC-1. The latter may comprise a conventional, multiple divider stage chip such as that known as frequency divider MC14521CP manufactured by the Motorola Corporation.

Capacitor 49 and resistor 48 have a common junction connection 63 which is connected to pin 2 of IC-1; these serve as a reset network to reset the dividers in IC-1 to a starting condition. If the power is turned off, then capacitor 49 charges through the resistor 48, thus providing a reset pulse to pin 2 of IC-1.

Resistor 65, variable resistor 66, and capacitor 67 are coupled to a common junction 68, with the opposite lead 69 of capacitor 67 being coupled to pins 6 and 7 of integrated circuit chip IC-1. It is to be noted that resistors 65 and 66, in combination with capacitor 67, form a resistance-capacitance network which, with the internal circuitry of IC-1 connecting into pins 4, 6, 7, and 9, constitutes an RC oscillator, i.e. oscillator 25 in FIG. 1. This oscillator oscillates at approximately 194 hertz, producing a square wave output of equivalent pulse width and pulse-spacing.

The frequency of the RC oscillator 25 is divided by IC-1 and therefore appears at respective signal frequencies at pins 11, 15, and 1. An pin 1, the signal is divided by two nineteen times; at pin 15, twenty-three times, and at pin 1, twenty-four times. Diodes 52, 53, and 54 feed these divided outputs to resistor 55 where the resultant output across such resistor is a series of alternating 22.5 minute on and off pulses of square-wave form. When these pulses are in the "off" state, then transistor 56 conducts current through resistor 62 and therefore into the gate or lead 60 of triac switch 14. The latter is also known as a thyristor or full-wave silicon-controlled rectifier, and may comprise the standard part nomenclature of 2N6071B, manufactued by Motorola Corporation. The series of pulses from lead 60 to triac 14 causes the same to conduct, via leads 12 and 15, so as to supply an interrupted voltage potential across receptacle 13. The latter may comprise a Leviton receptacle, part No. 1306 W.

Accordingly, a light lamp, radio or other means at X may be plugged into the unit. The unit will supply pulsed operating power to load X, whatever its form, so that there may be simulated an appearance of occupancy in the room, apartment, or store in which the device is employed.

The subject timer can be packaged in an extremely small package on the order of 1½ inches × 1½ inches × ½ inch, for example, and can simply be plugged into a conventional duplex wire outlet. What is provided is a solid state timer means which is extremely small and compact, and yet which can be employed as the terminal to receive the plug of an electrical appliance such as a radio or lamp, whereby the electrical appliance will be powered sequentially, and in accordance with the parameters of the timer, so that occupancy of the room or enclosure in which the timer is installed may be simulated. It is noted that the timer may be removed from a wall outlet simply by releasing the prongs therefrom.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

I claim:

1. A timer device including, in combination, an alternating current input, an alternating current output, oscillator means coupled to said input for generating an output series of pulses, frequency divider network means coupled to said oscillator means and responsive to said output series of pulses for producing separated, plural pulse trains of mutually differing periodicity, summing network means coupled to said frequency divider network means and responsive to said plural pulse trains for producing a signal comprising spaced trains of pulses, and separate means interposed between said alternating current input and said alternating current output, coupled to said summing network means, and responsive to said signal thereof for automatically intermittently connecting the voltage of said alternating current input to said alternating current output in correlation with pulse presence in said signal.

2. The device of claim 1 wherein said device includes as said separate means a triac switch.

3. The combination of claim 2 wherein said separate means includes a transistor stage intercoupling said summing network means with said triac switch.

4. The combination of claim 1 wherein said divider network means comprises a frequency-divider integrated circuit chip.

5. The combination of claim 4 wherein said oscillator means comprises resistance-capacitance circuit means connecting to and cofunctioning with said integrated circuit chip to constitute said oscillator means.

6. The combination of claim 1 wherein said device is provided with manually selectable bypass means for directly connecting said input to said output, whereby to selectively bypass said oscillator means, frequency divider network means, summing network means, and separate means.

7. The combination of claim 1 wherein said input and output respectively comprise an alternating current plug and socket, respectively, said device being provided with a direct-current power supply interposed between said plug and said oscillator means and frequency divider network means, whereby to supply power to said oscillator means and said frequency divider network means.

8. The combination of claim 1 wherein said frequency divider network means is provided with a signal reset circuit.

9. The combination of claim 1 wherein said summing network comprises a plural parallel-diode circuit in series with a voltage developing impedance.

* * * * *